United States Patent
Lo et al.

(10) Patent No.: US 10,327,060 B2
(45) Date of Patent: Jun. 18, 2019

(54) AIR PULSE GENERATING ELEMENT AND SOUND PRODUCING DEVICE

(71) Applicant: xMEMS Labs, Inc., Saratoga, CA (US)

(72) Inventors: Chiung C. Lo, San Jose, CA (US);
David Hong, Los Altos, CA (US);
Jemm Yue Liang, Sunnyvale, CA (US)

(73) Assignee: xMEMS Labs, Inc., Los Altos, CA (US)

( * ) Notice: Subject to any disclaimer, the term of this patent is extended or adjusted under 35 U.S.C. 154(b) by 0 days.

(21) Appl. No.: 16/172,876

(22) Filed: Oct. 29, 2018

(65) Prior Publication Data

US 2019/0141435 A1    May 9, 2019

Related U.S. Application Data

(60) Provisional application No. 62/719,694, filed on Aug. 19, 2018, provisional application No. 62/581,741, filed on Nov. 5, 2017.

(51) Int. Cl.
| | |
|---|---|
| *H04R 1/02* | (2006.01) |
| *H04R 1/28* | (2006.01) |
| *H04R 5/02* | (2006.01) |
| *H04R 9/06* | (2006.01) |

(52) U.S. Cl.
CPC .......... *H04R 1/28* (2013.01); *H04R 1/02* (2013.01); *H04R 5/02* (2013.01); *H04R 9/063* (2013.01); *H04R 2201/029* (2013.01)

(58) Field of Classification Search
CPC .. H04R 17/00; H04R 19/02; H04R 2201/003; H04R 2217/03
USPC .................................... 381/97, 345; 1/1
See application file for complete search history.

(56) References Cited

U.S. PATENT DOCUMENTS

| | | |
|---|---|---|
| 2013/0223023 A1 | 8/2013 | Dehe |
| 2016/0381464 A1* | 12/2016 | Elyada ............... H04R 19/02 381/97 |
| 2017/0201192 A1 | 7/2017 | Tumpold |

FOREIGN PATENT DOCUMENTS

WO    2016/202790 A2    12/2016

OTHER PUBLICATIONS

Liang, Title of Invention: Sound Producing Device, U.S. Appl. No. 16/125,761, filed Sep. 9, 2018.
David Hong et al., Title: Method for Manufacturing Air Pulse Generating Element, pending U.S. Appl. No. 16/380,988, filed Apr. 10, 2019.

* cited by examiner

*Primary Examiner* — Curtis A Kuntz
*Assistant Examiner* — Julie X Dang
(74) *Attorney, Agent, or Firm* — Winston Hsu

(57) ABSTRACT

An air pulse generating element, disposed in a sound producing device, includes a membrane, disposed within a chamber; and a plurality of valves, disposed by the membrane within the chamber, configured to seal a plurality of openings of the chamber in response to a plurality of valve control signals; wherein the membrane and the plurality of valves are all fabricated at a first layer.

18 Claims, 11 Drawing Sheets

AIR PULSE GENERATING ELEMENT AND SOUND PRODUCING DEVICE

CROSS REFERENCE TO RELATED APPLICATIONS

This application claims the benefit of U.S. provisional application No. 62/581,741, filed on Nov. 5, 2017, and U.S. provisional application No. 62/719,694, filed on Aug. 19, 2018, which are all incorporated herein by reference.

BACKGROUND OF THE INVENTION

1. Field of the Invention

The present application relates to an air pulse generating element and a sound producing device, and more particularly, to an air pulse generating element and a sound producing device with low manufacturing complexity and low yield loss rate.

2. Description of the Prior Art

Speaker driver and back enclosure are two major design challenges in the speaker industry. It is difficult for a conventional speaker driver to cover an entire audio frequency band, e.g., from 20 Hz to 20 KHz, due to a membrane displacement D is proportional to $1/f^2$, i.e., $D \propto 1/f^2$. On the other hand, to produce sound with high fidelity, a volume/size of back enclosure for the conventional speaker is required to be sufficiently large.

To combat against the design challenges in the above, applicant has proposed an air pulse generating element and a sound producing device in U.S. application Ser. No. 16/125,761, which produce sound using a plurality of pulses at a pulse rate, where the pulse rate is higher than a maximum audible frequency and the plurality of pulses is regarded as being amplitude modulated according to an input audio signal. By exploiting a low pass effect caused by ambient environment and human ear structure, a sound corresponding to the input audio signal is perceived. The sound producing device in U.S. application Ser. No. 16/125,761 is able to cover the entire audio frequency band, and an enclosure volume/size of which is significantly reduced.

However, the air pulse generating element in U.S. application Ser. No. 16/125,761 is complicated to be manufactured, because it requires 3 different layers to manufacture the valves and the membrane thereof, suffering from high yield loss rate. Specifically, FIG. 1 is a sectional view of an air pulse generating element 10 in U.S. application Ser. No. 16/125,761. The air pulse generating element 10 comprises valves 101-104, a membrane 105, a front faceplate 106 and a back faceplate 107. The membrane 105 partitions a chamber 108 into a front sub-chamber 108_f and a back sub-chamber 108_b. The air pulse generating element 10 is a MEMS (micro electrical mechanical system) device. The valves 101 and 103 are fabricated at a layer 1, the membrane 105 is fabricated at a layer 3, and the valves 102 and 104 are fabricated at a layer 5. Manufacturing the valves 101-104 and the membrane 105 at the layers 1, 3, 5 require high wafer cost. In addition, one yield loss of one single layer among the layers 1, 3, 5 would lead to a failure of the entire air pulse generating element 10. Thus, the yield loss rate of the 3-layered air pulse generating element 10 is high.

Therefore, it is necessary to lower the manufacturing complexity of the air pulse generating element.

SUMMARY OF THE INVENTION

It is therefore a primary objective of the present application to provide an air pulse generating element and a sound producing device with low manufacturing complexity and low yield loss rate.

An embodiment of the present invention discloses an air pulse generating element disposed in a sound producing device. The air pulse generating element comprises a membrane, disposed within a chamber; and a plurality of valves, disposed by the membrane within the chamber, configured to seal a plurality of openings of the chamber in response to a plurality of valve control signals; wherein the membrane and the plurality of valves are all fabricated at a first layer.

An embodiment of the present invention further discloses a sound producing device comprising a plurality of air pulse generating elements, wherein an air pulse generating element comprises a membrane, disposed within a chamber; and a plurality of valves, disposed by the membrane within the chamber, configured to seal a plurality of openings of the chamber in response to a plurality of valve control signals; wherein the membrane and the plurality of valves are all fabricated at a first layer; and a control unit, configured to generate the plurality of valve control signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
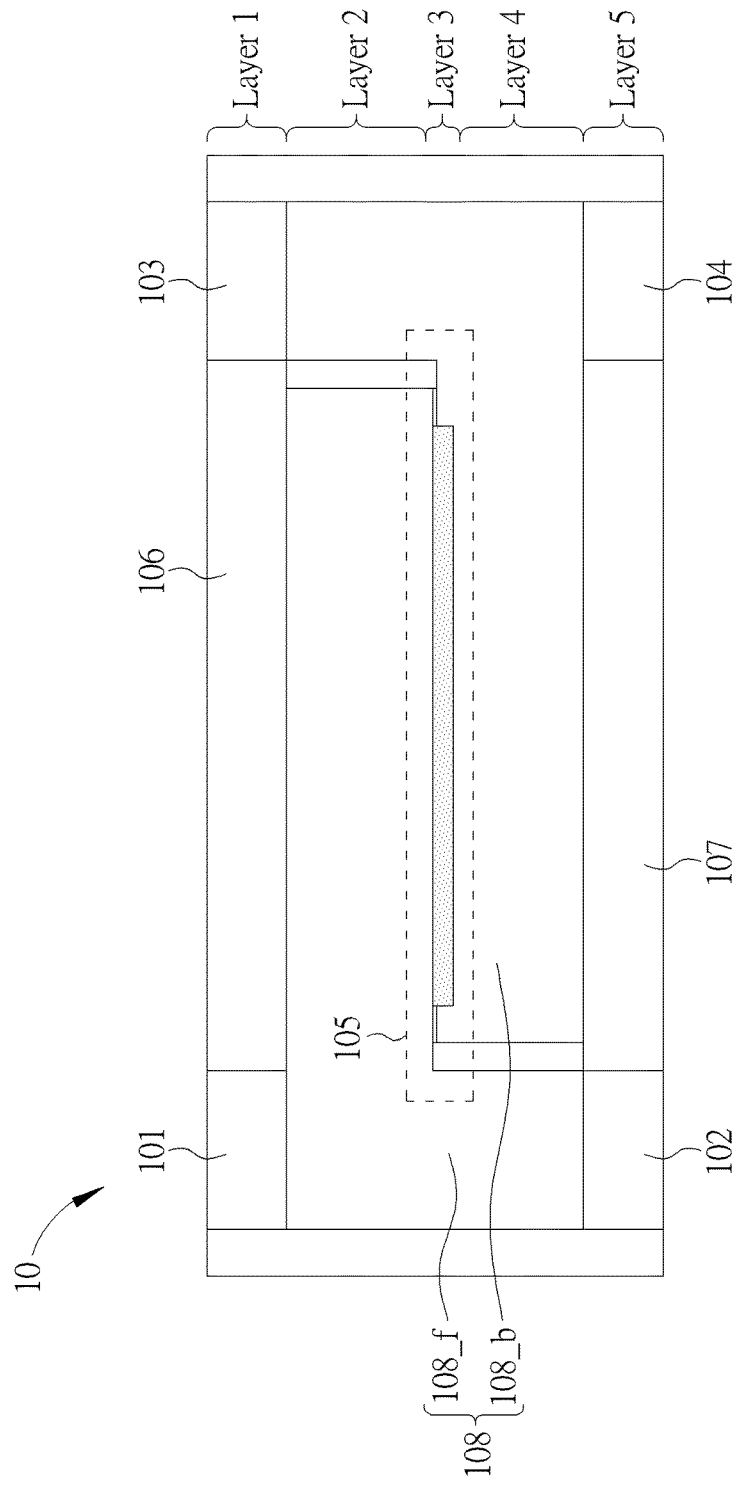
FIG. 1 is a schematic diagram of an air pulse generating element in the art.
Figure 2:
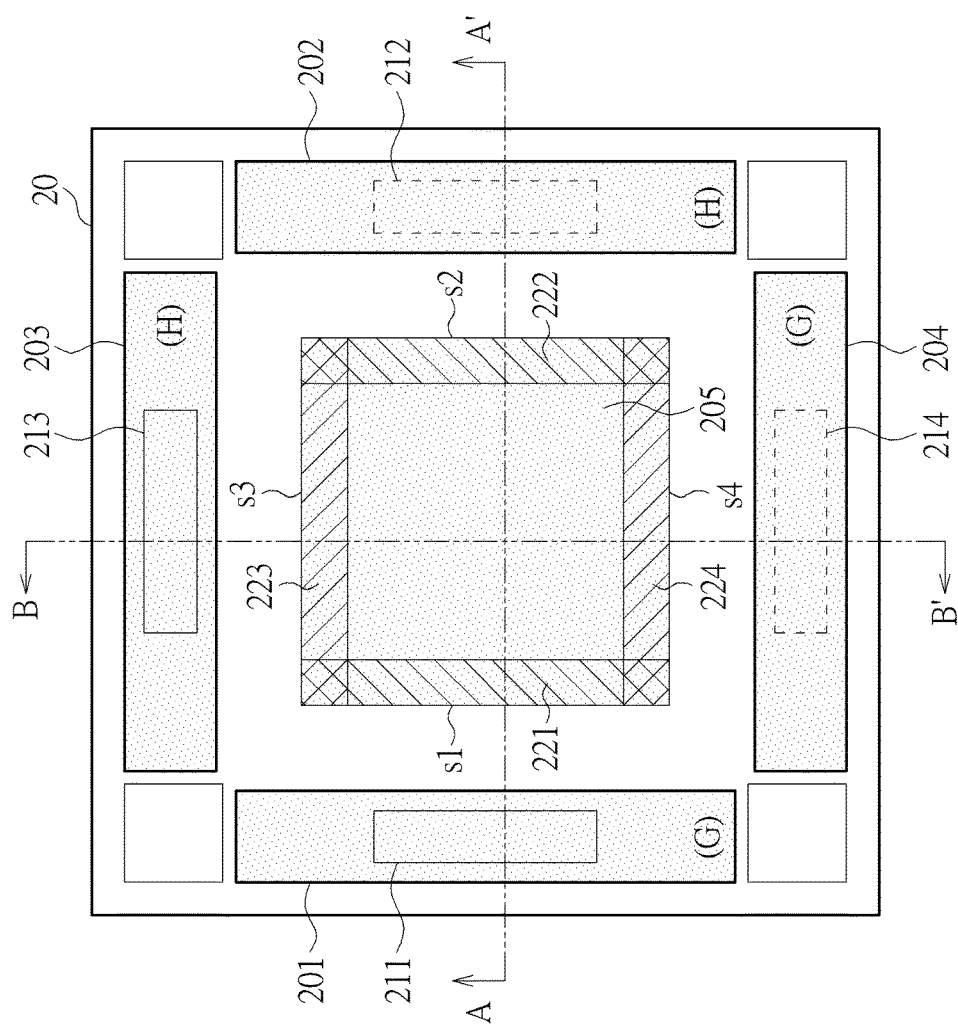
FIG. 2 is a top view of an air pulse generating element according to an embodiment of the present invention.
Figure 3:
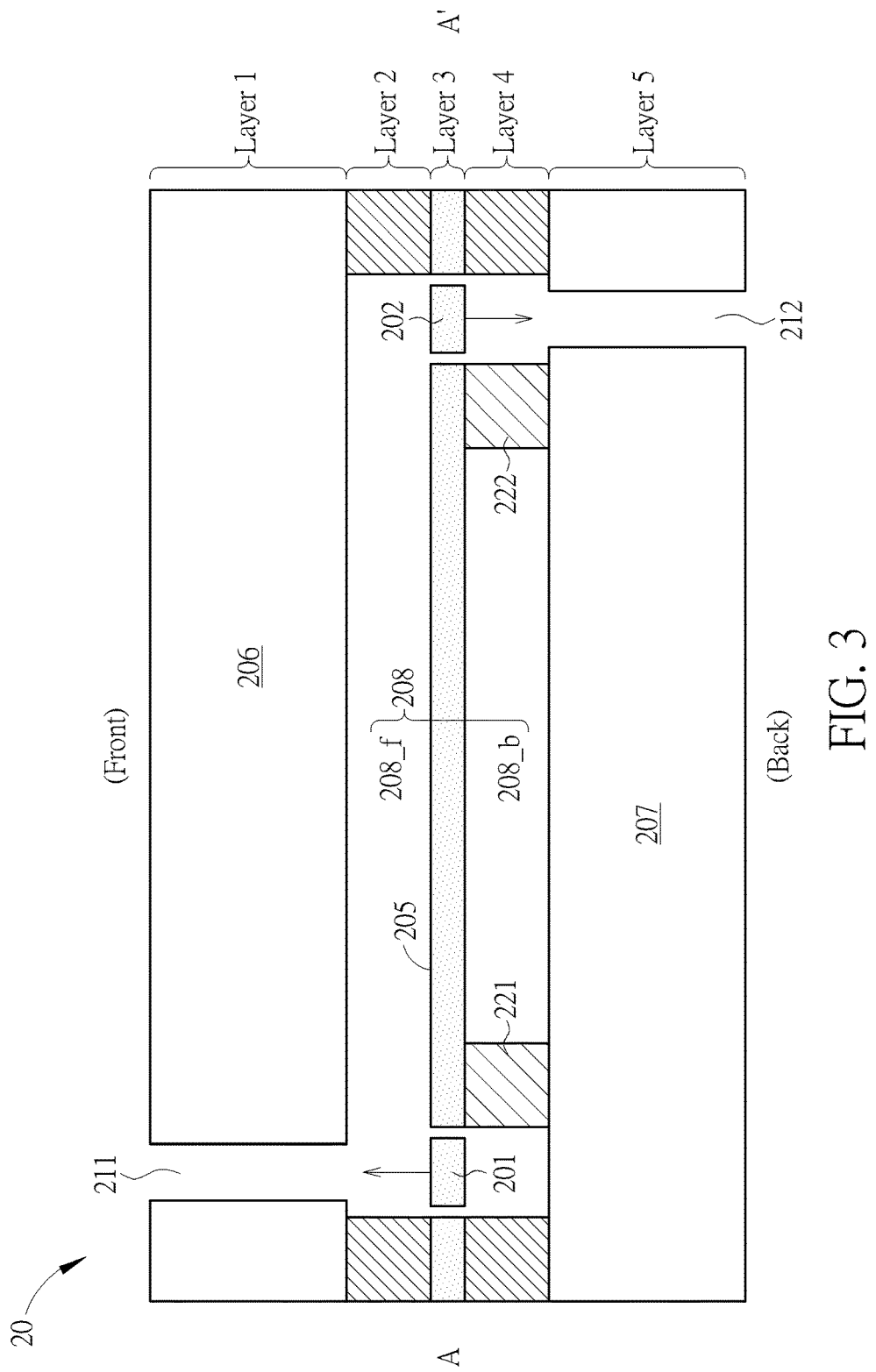
FIG. 3 is a first sectional view of the air pulse generating element of FIG. 2.
Figure 4:
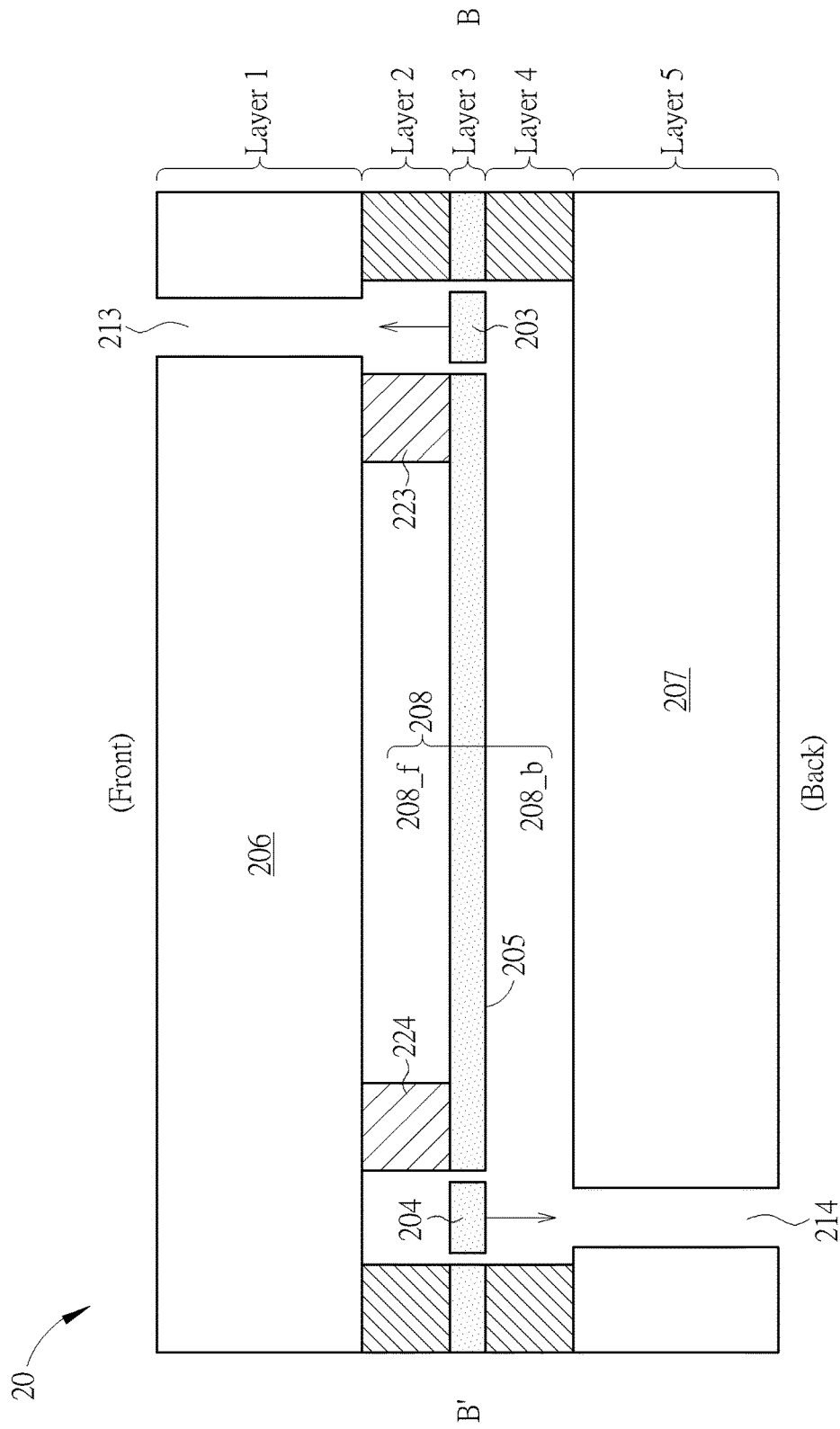
FIG. 4 is a second sectional view of the air pulse generating element of FIG. 2.

FIG. 2 is a top view of an air pulse generating element 20 according to an embodiment of the present invention. FIG. 3 is a sectional view of the air pulse generating element 20 through an A-A' line shown in FIG. 2. FIG. 4 is a sectional view of the air pulse generating element 20 through a B-B' line shown in FIG. 2. The air pulse generating element 20 comprises valves 201-204, a membrane 205, a front faceplate 206 and a back faceplate 207. The valves 201-204 are disposed by four sides s1-s4 of the membrane 205, respectively, within a chamber 208. The membrane 205 partitions the chamber 208 into a front sub-chamber 208_f and a back sub-chamber 208_b. The valves 201-204 may be controlled by a plurality of valve control signals, respectively. The air pulse generating element 20 is a MEMS (micro electrical mechanical system) device. In an embodiment shown in FIGS. 2-4, the front faceplate 206 is disposed at a layer 1, the valves 201-204 and the membrane 205 are all fabricated at a layer 3, and the back faceplate 207 is disposed at a layer 5. Supporting elements 223, 224 are fabricated at a layer 2, and supporting elements 221, 222 are fabricated at a layer 4.

Openings 211 and 213 are formed within the front faceplate 206, and openings 212 and 214 are formed within the back faceplate 207. In an embodiment, the valve 201 is controlled in response to a valve control signal G to move upward to seal the openings 211, the valve 202 is controlled in response to a valve control signal H to move downward to seal the openings 212, the valve 203 is controlled in response to the valve control signal H to move upward to seal the openings 211, and the valve 204 is controlled in response to the valve control signal G to move downward to seal the openings 214.

In the embodiment stated in the above, the valve control signals G and H are configured to control the valves 201-204 to perform an open-and-close movement. When the valve control signal G controls the valves 201, 204 to be opened, denoted as "G=1", the opening 211, 214 are not sealed and air flows through the opening 211, 214. When the valve control signal G controls the valves 201, 204 to be closed, denoted as "G=0", the opening 211, 214 are sealed and air is not able to flow through the opening 211, 214. When the valve control signal H controls the valves 202, 203 to be opened, denoted as "H=1", the opening 212, 213 are not sealed and air flows through the opening 212, 213. When the valve control signal H controls the valves 202, 203 to be closed, denoted as "H=0", the opening 212, 213 are sealed and air is not able to flow through the opening 212, 213.

In addition, the membrane 205 is controlled in response to a membrane driving voltage $V_{MBN}$ to either move upward (i.e., from back to front) or move downward (i.e., from front to back). In other words, the valve control signals G and H are configured to control the valves 201-204 to perform an open-and-close movement, and the membrane driving voltage $V_{MBN}$ is configured to drive the membrane to perform an up-and-down movement. When the membrane 205 moves upward, an instantaneous front air pressure of the front sub-chamber 208_f is increased and an instantaneous back air pressure of back sub-chamber 208_b is decreased. When the membrane 205 moves downward, the instantaneous front air pressure of the front sub-chamber 208_f is decreased and the instantaneous back air pressure of the back sub-chamber 208_b is increased.

Figure 5:
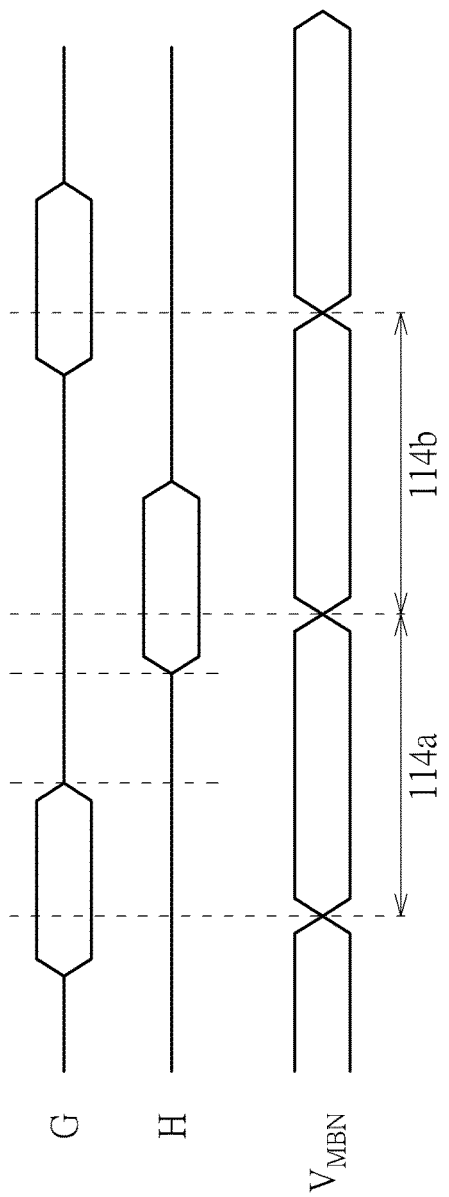
FIG. 5 is a timing diagram of valve control signals and a membrane driving voltage according to an embodiment of the present invention.

FIG. 5 is a timing diagram of the valve control signals G, H and the membrane driving voltage $V_{MBN}$ according to an embodiment of the present invention. In FIG. 5, hexagons within the timing diagram of the valve control signals G, H represents that the corresponding valve(s) is opened, i.e., G=1 or H=1, and straight lines within the timing diagram of the valve control signals G, H represents that the corresponding valve (s) is closed, i.e., G=0 or H=0. The valve control signals G, H and the membrane driving voltage $V_{MBN}$ are mutually synchronized.

A pulse cycle 114a begins at a status of G=1 and H=0. If the membrane driving voltage $V_{MBN}$ drives the membrane 205 to move upward (i.e., from back to front) during the pulse cycle 114a, the air is pushed from the front sub-chamber 208_f to a front environment through the opening 211 and pulled from a back environment to the back sub-chamber 208_b through the opening 214, and therefore a positive air pulse (in a back-to-front direction) is generated. If the membrane driving voltage $V_{MBN}$ drives the membrane 205 to move downward (i.e., from front to back) during the pulse cycle 114a, the air is pulled from the front environment to the front sub-chamber 208_f through the opening 211 and pushed from the back sub-chamber 208_b to the back environment through the opening 214, and therefore a negative air pulse (in a front-to-back direction) is generated.

In other words, during the pulse cycle 114a beginning at the status of G=1 and H=0, i.e., the valves 201, 204 being opened and the 202, 203 being closed, the membrane movement direction corresponding of the membrane 205 would be substantially the same as the air pulse direction.

A pulse cycle 114b begins at a status of G=0 and H=1. If the membrane driving voltage $V_{MBN}$ drives the membrane 205 to move upward during the pulse cycle 114b, the air is pushed from the front sub-chamber 208_f to the back environment through the opening 212 and pulled from the front environment to the back sub-chamber 208_b through the opening 213, and therefore a negative air pulse is generated. If the membrane driving voltage $V_{MBN}$ drives the membrane 205 to move downward during the pulse cycle 114b, the air is pulled from the back environment to the front sub-chamber 208_f through the opening 212 and pushed from the back sub-chamber 208_b to the front environment through the opening 213, and therefore a positive air pulse is generated.

In other words, during the pulse cycle 114b beginning at the status of G=0 and H=1, i.e., the valves 201, 204 being closed and the 202, 203 being opened, the membrane movement direction corresponding of the membrane 205 would be substantially opposite to the air pulse direction.

Operations of the air pulse generating element 20 are tabulated in Table I.

TABLE I

| Up-and-Down Movement of | Status of Valves at Beginning of Pulse Cycle | |
| --- | --- | --- |
| Membrane | G = 1, H = 0 | G = 0, H = 1 |
| Downward | Front-to-Back | Back-to-Front |
| Upward | Back-to-Front | Front-to-Back |

In addition, during the pulse cycle 114a or 114b, if the membrane driving voltage $V_{MBN}$ is constant and the membrane 205 remains static, moving neither upward nor downward, a null pulse is generated.

Note that, an air flow direction within the front sub-chamber 208_f is along the A-A' direction between the valve 201 and the valve 202, and an air flow direction within the back sub-chamber 208_b is along the B-B' direction between the valve 203 and the valve 204.

Therefore, the air pulse generating element 20 is able to perform the same function of the air pulse generating element 10 disclosed in U.S. application Ser. No. 16/125, 761. Similar to the air pulse generating element 10, the air pulse generating element 20 is able to generate a plurality of air pulses in response to the valve control signals G, H and the membrane driving voltage $V_{MBN}$ at a pulse rate, where the pulse rate of the plurality of air pulses is higher than a maximum audible frequency. Different from the air pulse generating element 10, the valves 201-204 and the membrane 205 are coplanar, which means that the valves 201-204 and the membrane 205 are fabricated at the same layer. Thereby, a manufacturing cost is reduced and a yield rate is improved.

Figure 6:
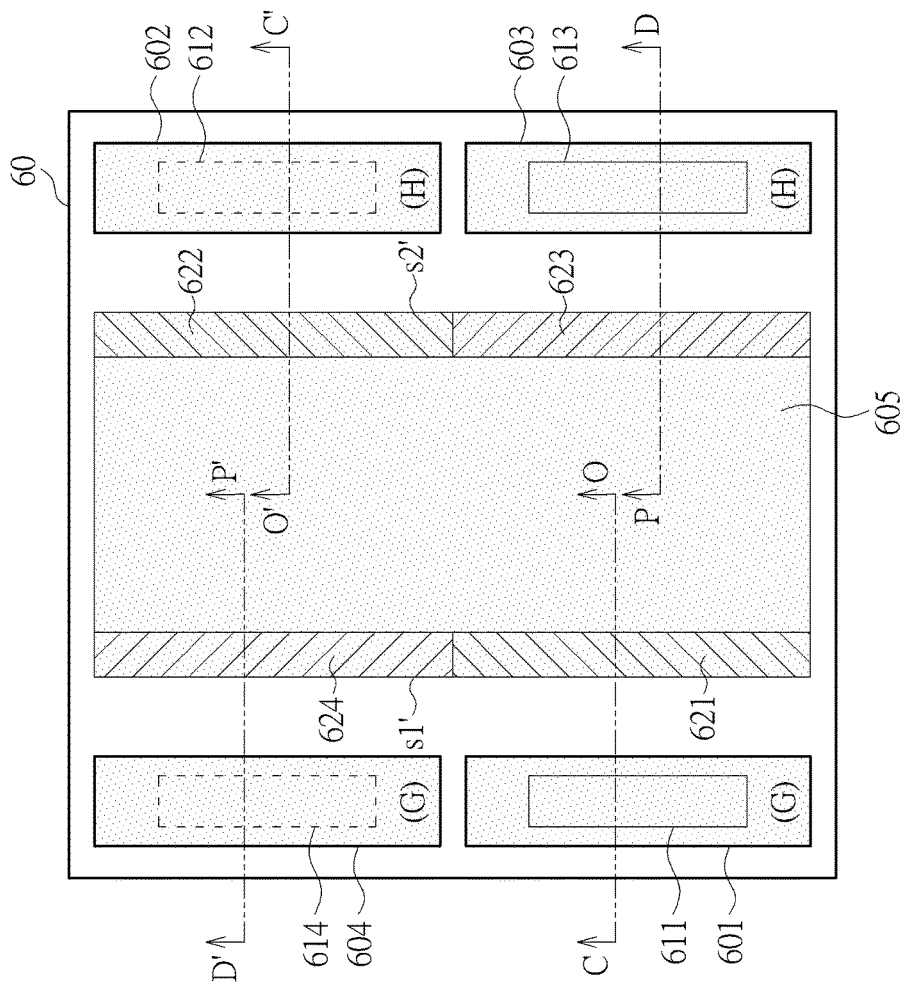
FIG. 6 is a top view of an air pulse generating element according to an embodiment of the present invention.
Figure 7:
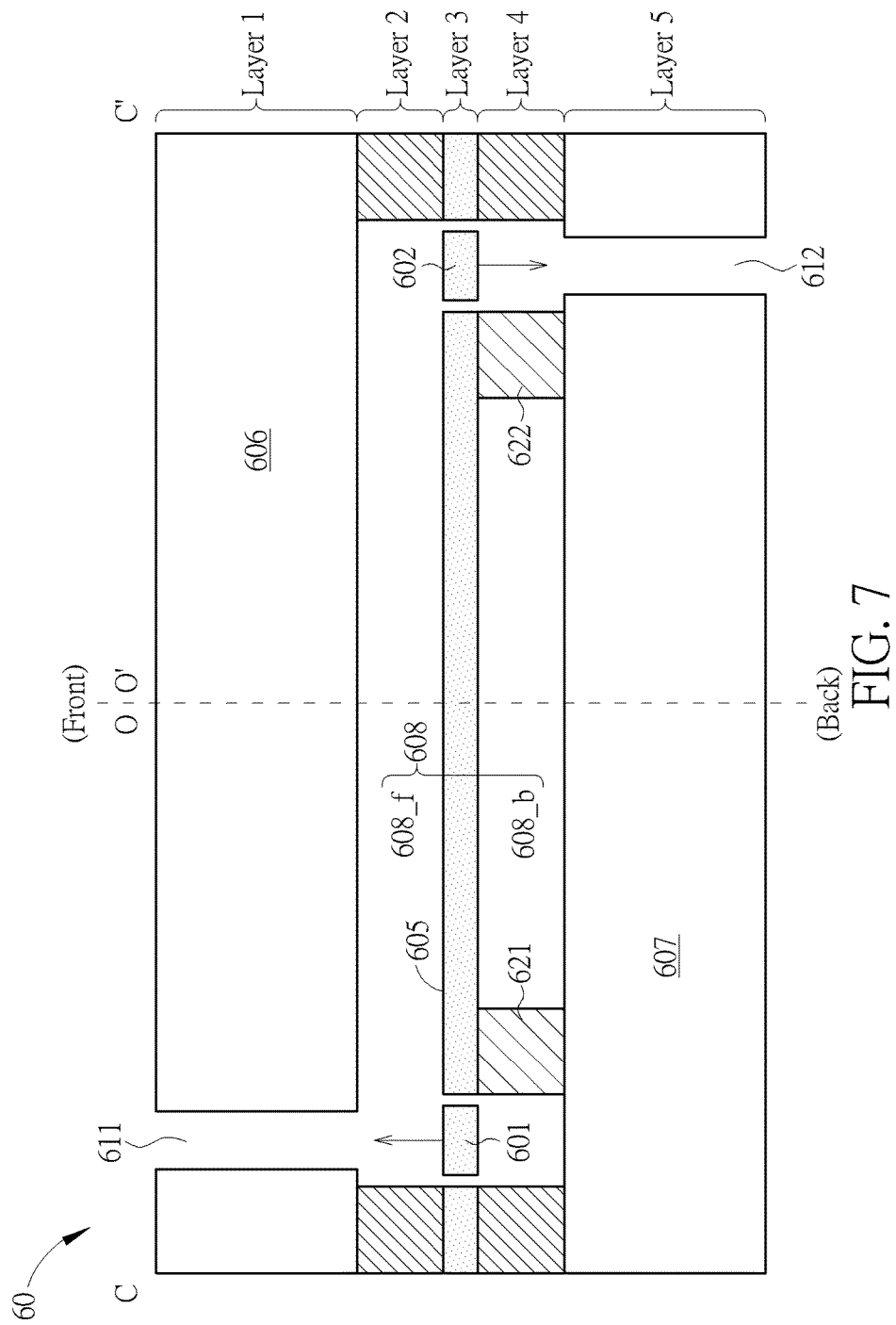
FIG. 7 is a first sectional view diagram of the air pulse generating element of FIG. 6.
Figure 8:
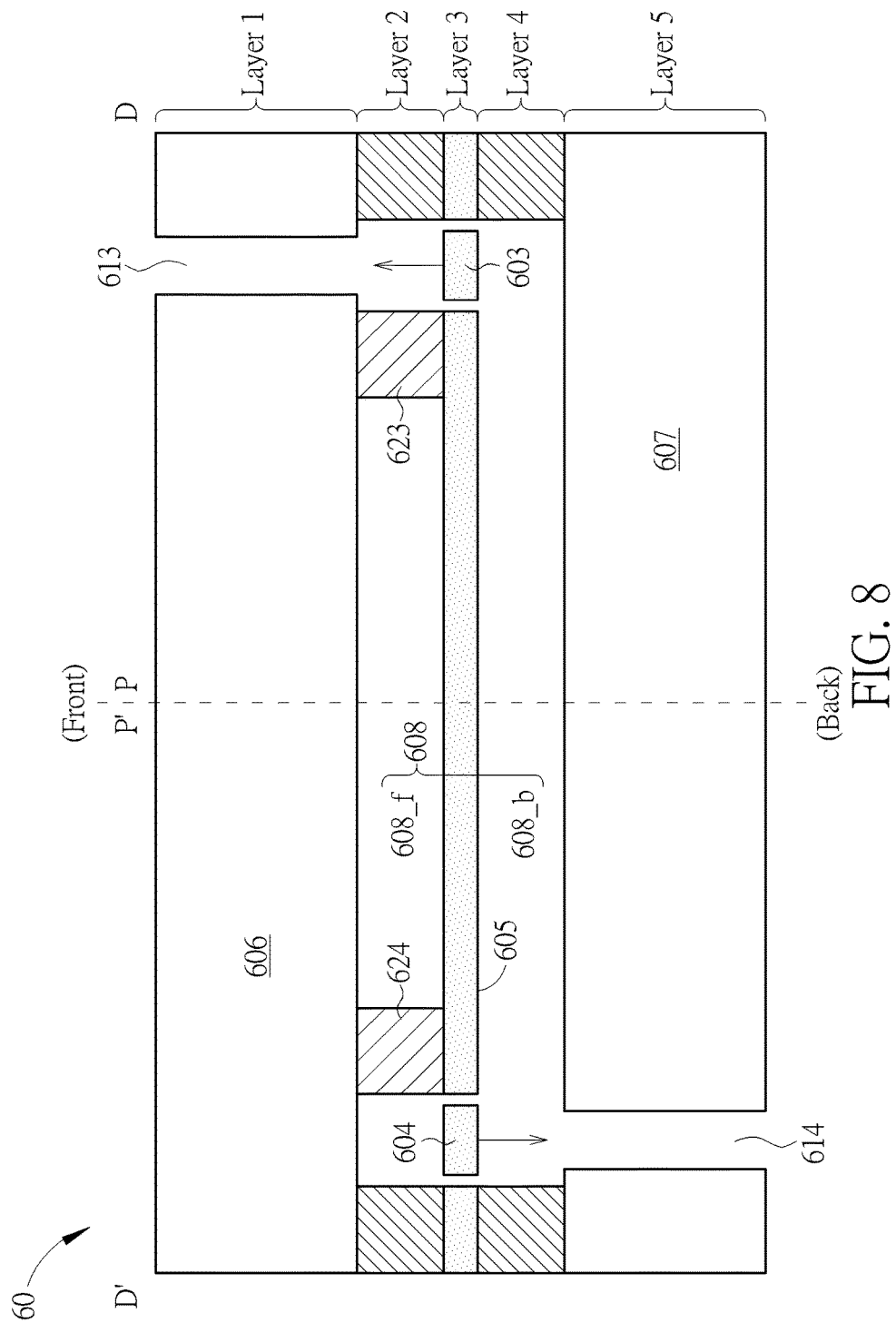
FIG. 8 is a second sectional view diagram of the air pulse generating element of FIG. 6.

FIG. 6 is a top view of an air pulse generating element 60 according to an embodiment of the present invention. FIG. 7 is a sectional view diagram of the air pulse generating element 60 through a C-O line and an O'-C' line shown in FIG. 6. FIG. 8 is a sectional view diagram of the air pulse generating element 60 through a D-P line and a P'-D' line shown in FIG. 6. A cross sectional view through the C-O line is illustrate in the left half of the FIG. 7, a cross sectional view through the O'-C' line is illustrate in the right half of the FIG. 7. A cross section view through the D-P line is illustrate in the right half of the FIG. 8, a cross sectional view through the P'-D' line is illustrate in the left half of the FIG. 8. The air pulse generating element 60 is also a MEMS device.

Similar to the air pulse generating element 20, the air pulse generating element 60 comprises valves 601-604, a membrane 605, a front faceplate 606 and a back faceplate 607. The membrane 605 partitions the chamber 608 into a front sub-chamber 608_f and a back sub-chamber 608_b. In an embodiment shown in FIGS. 6-8, the front faceplate 606 is disposed at the layer 1, the valves 601-604 and the membrane 605 are all fabricated at the layer 3, and the back faceplate 607 is disposed at the layer 5. Supporting elements 623, 624 are fabricated at the layer 2, and supporting elements 621, 622 are fabricated at the layer 4. Openings 611 and 613 are formed within the front faceplate 606, and openings 612 and 614 are formed within the back faceplate 607. The valves 601 and 604 are controlled by the valve control signal G to seal the openings 611 and 614, respectively. The valves 602 and 603 are controlled by the valve control signal H to seal the openings 612 and 613, respectively.

If the membrane 605 is driven to move upward during the pulse cycle 114a (beginning at the status of G=1 and H=0), the air is pushed from the front sub-chamber 608_f to a front environment through the opening 611 and pulled from a back environment to the back sub-chamber 608_b through the opening 614, and therefore a positive air pulse is generated. If the membrane 605 is driven to move downward during the pulse cycle 114a (beginning at the status of G=1 and H=0), the air is pulled from the front environment to the front sub-chamber 608_f through the opening 611 and pushed from the back sub-chamber 608_b to the back environment through the opening 614, and therefore a negative air pulse is generated.

If the membrane 605 is driven to move upward during the pulse cycle 114b (beginning at the status of G=0 and H=1), the air is pushed from the front sub-chamber 608_f to the back environment through the opening 612 and pulled from the front environment to the back sub-chamber 608_b through the opening 613, and therefore a negative air pulse is generated. If the membrane 605 is driven to move downward during the pulse cycle 114b (beginning at the status of G=0 and H=1), the air is pulled from the back environment to the front sub-chamber 608_f through the opening 612 and pushed from the back sub-chamber 608_b to the front environment through the opening 613, and therefore a positive air pulse is generated.

An air flow direction within the front sub-chamber 608_f is between the valve 601 and the valve 602, and an air flow direction within the back sub-chamber 608_b is between the valve 603 and the valve 604.

Different from the air pulse generating element 20, the valves 601, 604 are disposed by a side s1' of the membrane 605, and the valves 602, 603 are disposed by a side s2' of the membrane 605.

Note that, as FIG. 2 show, zones at four corners of the air pulse generating element 20 are unusable. Compared to the air pulse generating element 20, the air pulse generating element 60 has better area utilization since the air pulse generating element 60 does not have unusable zones at four corners. In addition, a ratio of a membrane area of the membrane 605 in related to an entire area of the air pulse generating element 60 is larger. That is, given the area of the air pulse generating element 60 is the same as which of the air pulse generating element 20, the membrane area of the membrane 605 may be larger than which of the membrane 205.

Nevertheless, compared to the air pulse generating element 60, the airflow sweeping is smoother in the front sub-chamber 208_f and the back sub-chamber 208_b. Thus, the air pulse generating element 20 consumes less energy/heat loss than the air pulse generating element 60 and has better energy efficiency.

In an embodiment, the valves 201-204, 601-604 and the membranes 205, 605 may be made of single crystal silicon. The valves 201-204 and the membrane 205 may be fabricated from one common layer (e.g., the layer 3 in FIG. 2) of single crystal silicon, so may the valves 601-604 and the membrane 605. The valves 201-204 and the membrane 205 may be fabricated from one single SOI (silicon on insulator) wafer, so may the valves 601-604 and the membrane 605.

Figure 9:
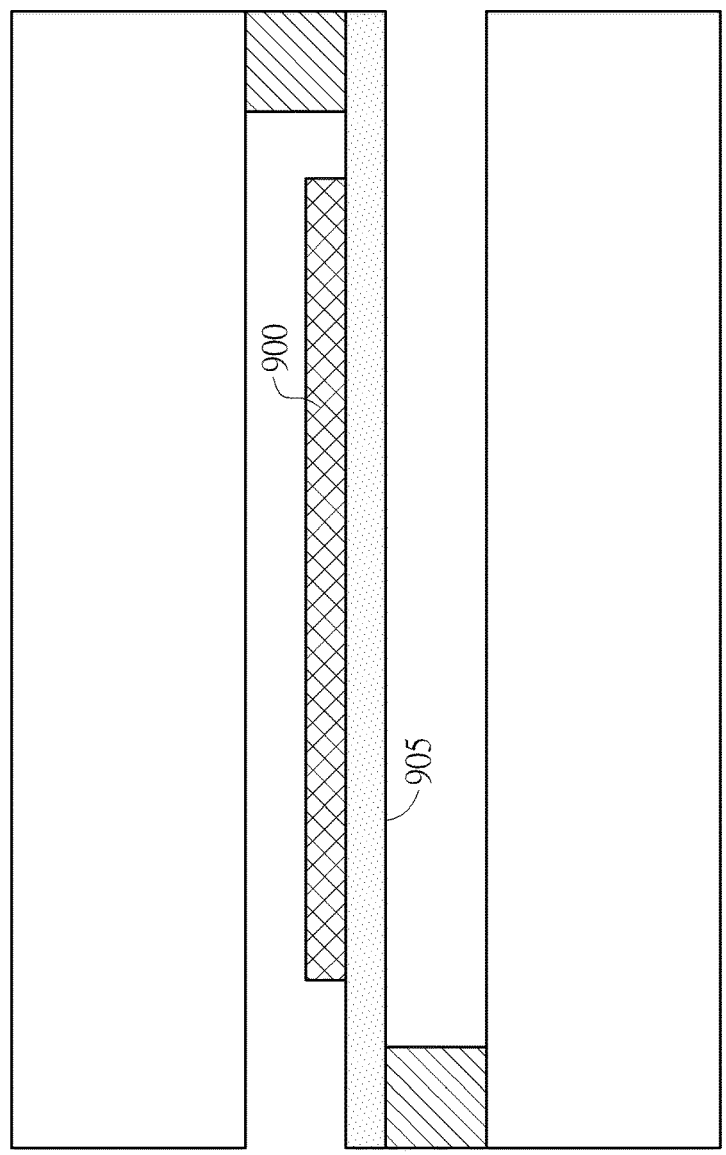
FIG. 9 is a schematic diagram of a membrane actuator according to an embodiment of the present invention.

In addition, the air pulse generating element of the present invention may comprise a membrane actuator disposed on the membrane. As shown in FIG. 9, a membrane actuator 900 is disposed on a membrane 905. The membrane 905 may be either the membrane 205 or the membrane 605. The membrane actuator 900 may receive the membrane driving voltage $V_{MBN}$. When the membrane driving voltage $V_{MBN}$ is applied to the membrane actuator 900, the membrane actuator 900 would be deformed to be bended upward or downward, so would the membrane 905. The membrane actuator 900 may be driven by a piezoelectric force, an electrostatic force, an electromagnetic force or an electrothermal force, and not limited thereto.

For example, the membrane actuator 900 may be a piezoelectric actuator comprising a piezoelectric layer sandwiched between two electrodes. The driving voltage $V_{MBN}$ is applied on the two electrodes. The piezoelectric layer may, but not limited to, be made of PZT (lead zirconate titanate) or AlScN (scandium doped aluminum nitride). PZT, and epi-PZT in particular, is one of preferred piezoelectric materials due to its high $\varepsilon_{31}$. On the other hand, AlScN possesses symmetrical bipolar driving characteristics which can simplify the geometric design of the air pulse generating element.

For example, the membrane actuator 900 may be an electromagnetic actuator comprising coils. A current may flow, within the electromagnetic actuator 900, through a specific direction, e.g., the B-B' direction, and a magnetic field is applied in another specific direction, e.g., the A-A' direction, then a Lorentz force is produced and the membrane 905 may be forced to move upward or downward.

Figure 10:
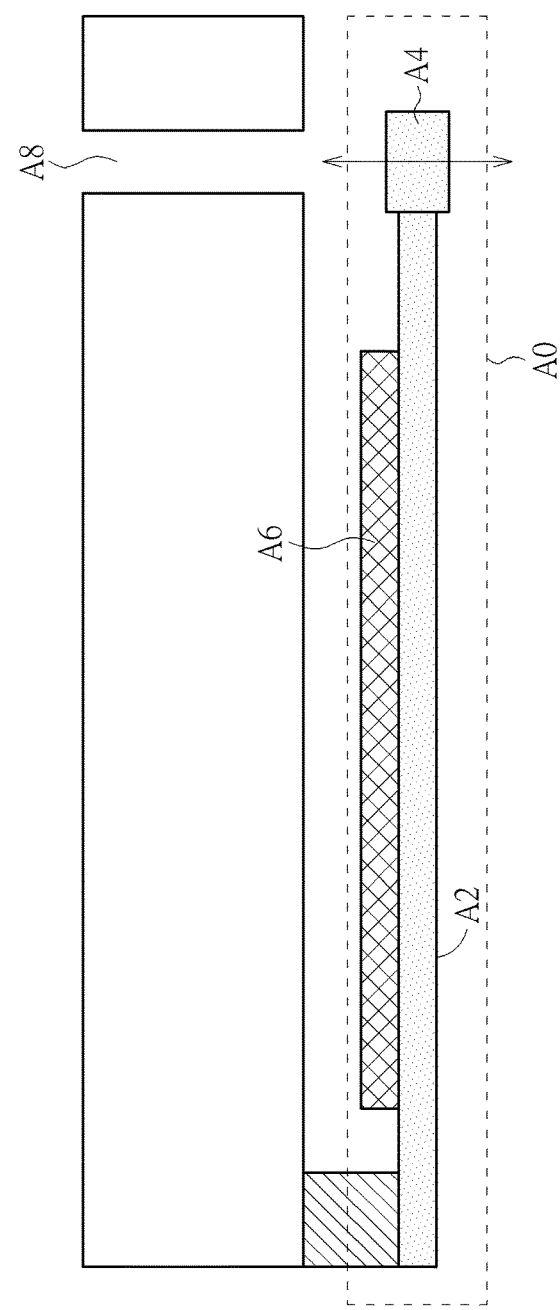
FIG. 10 is a schematic diagram of a valve according to an embodiment of the present invention.

In addition, the air pulse generating element of the present invention may comprise a valve actuator. FIG. 10 is a schematic diagram of a valve A0 according to an embodiment of the present invention. The valve A0 may be a realization of the valve 201-204 and 601-604. The valve A0 comprises a cantilever structure A2 and a cap structure A4, and a valve actuator A6 is disposed on the cantilever structure A2. The valve actuator A6 receives the valve control signal, which may be G or H. When the valve control signal is applied to the valve actuator A6, the cap structure A4 is forced to move upward (or downward) to seal an opening A8 corresponding to the valve A0. The valve actuator A6 may also be a piezoelectric actuator, an electrostatic, an electromagnetic actuator or an electrothermal actuator. Operational principles of the valve actuator A6 is the same as which if the valve actuator 900, which is narrated herein for brevity. The structure A2 is illustrated as a cantilever-type (a.k.a., a clamped-free type) structure for brevity, which is not limited thereto. Clamped-clamped type, free-free type, or a structural combination of these types are also applicable and within the scope of the present invention.

Figure 11:
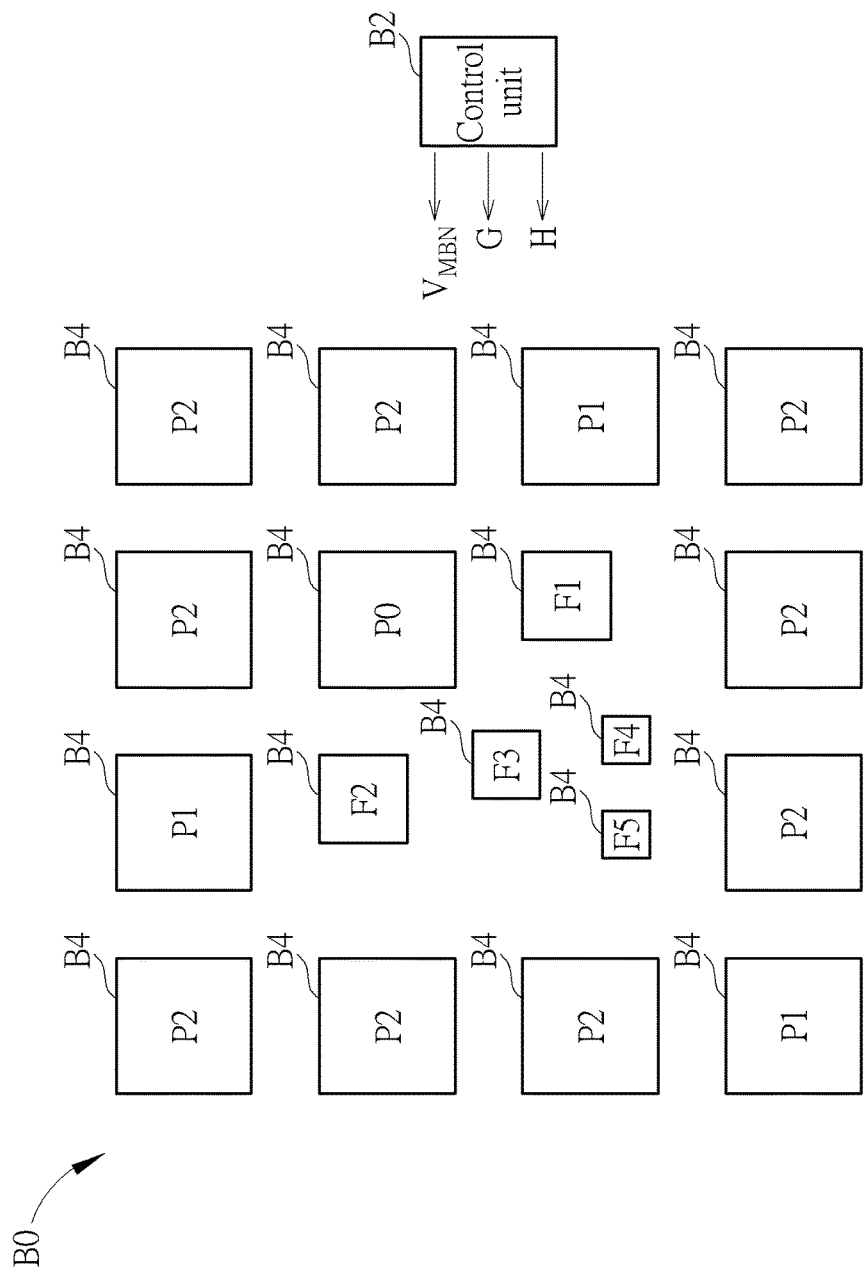
FIG. 11 is a schematic diagram of a sound producing device according to an embodiment of the present invention.

The air pulse generating element 20/60 may be applied/disposed in a sound producing device. FIG. 11 is a schematic diagram of a sound producing device B0 according to an embodiment of the present invention. The sound producing device B0 comprises a plurality of air pulse generating elements B4 and a control unit B2. The plurality of air pulse generating elements B4 are grouped into air pulse generating groups labeled as P0, P1, P2, and F1-F5. The control unit B2 is configured to generate the valve control signals G, H and the membrane driving voltage $V_{MBN}$. Details of the sound producing device BO may be referred to U.S. application Ser. No. 16/125,761, which is not narrated herein for brevity.

In summary, in the air pulse generating element of the present invention, the valves and the membrane are coplanar or fabricated at the same layer, which reduces manufacturing cost and lower the yield rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An air pulse generating element, disposed in a sound producing device, comprising: a membrane, disposed within a chamber; and a plurality of valves, disposed by the membrane within the chamber, configured to seal a plurality of openings of the chamber in response to a plurality of valve control signals, wherein the plurality of valves comprises
   a first valve, configured to seal a first opening of the chamber in response to a first valve control signal, wherein the first opening is formed on a first faceplate of the air pulse generating element, and the first faceplate is disposed at a second layer;
   a second valve, configured to seal a second opening of the chamber in response to a second valve control signal, wherein the second opening is formed on a second faceplate of the air pulse generating element, and the second faceplate is disposed at a third layer,
   a third valve, configured to seal a third opening of the chamber in response to a third valve control signal, wherein the third opening is formed on the first faceplate; and
   a fourth valve, configured to seal a fourth opening of the chamber in response to a fourth valve control signal, wherein the fourth opening is formed on the second faceplate of the air pulse generating element; wherein the membrane and the plurality of valves are all fabricated at a first layer.

2. The air pulse generating element of claim 1, wherein the first valve is disposed by a first side of the membrane; the second valve is disposed by a second side of the membrane; the third valve is disposed by a third side of the membrane; and the fourth valve is disposed by a fourth side of the membrane.

3. The air pulse generating element of claim 2, wherein the first side is opposite to the second side, and the third side is opposite to the fourth side.

4. The air pulse generating element of claim 1, wherein the first valve and the fourth valve are disposed by a first side of the membrane; and the second valve and the third valve are disposed by a second side of the membrane.

5. The air pulse generating element of claim 4, wherein the first side is opposite to the second side.

6. The air pulse generating element of claim 1, wherein the membrane partitions the chamber into a first sub-chamber and a second sub-chamber; a first air flow direction within the first sub-chamber is between the first valve and the second valve; and a second air flow direction within the second sub-chamber is between the third valve and the fourth valve.

7. The air pulse generating element of claim 1, wherein the third valve control signal is equal to the second valve control signal, and the fourth control signal is equal to the first valve control signal.

8. The air pulse generating element of claim 1, wherein during a pulse cycle beginning at a status of the first valve and the fourth valve being opened and the second valve and the third valve being closed, an air pulse in a first air pulse direction is generated when the membrane is driven to move toward a first direction, and the first air pulse direction and the first direction are the same.

9. The air pulse generating element of claim 1, wherein during a pulse cycle beginning at a status of the first valve and the fourth valve being closed and the second valve and the third valve being opened, an air pulse in a second air pulse direction is generated when the membrane is driven to move toward a second direction, and the second air pulse direction and the second direction are opposite.

10. The air pulse generating element of claim 1, further comprising:
    a membrane actuator, disposed on the membrane; and
    a plurality of valve actuators, disposed on the plurality of valves;
    wherein the membrane actuator is driven by a piezoelectric force, an electrostatic force, an electromagnetic force or an electrothermal force;
    wherein the plurality of valve actuators are driven by a piezoelectric force, an electrostatic force, an electromagnetic force or an electrothermal force.

11. The air pulse generating element of claim 1, wherein the air pulse generating element generates a plurality of air pulses in response to the plurality of valve control signals at a pulse rate, and the pulse rate of the plurality of air pulses is higher than a maximum audible frequency.

12. A sound producing device, comprising: a plurality of air pulse generating elements, wherein an air pulse generating element comprises: a membrane, disposed within a chamber; and
    a plurality of valves, disposed by the membrane within the chamber, configured to seal a plurality of openings of the chamber in response to a plurality of valve control signals, wherein the plurality of valves comprises
    a first valve, configured to seal a first opening of the chamber in response to a first valve control signal, wherein the first opening is formed on a first faceplate of the air pulse generating element, and the first faceplate is disposed at a second layer;

a second valve, configured to seal a second opening of the chamber in response to a second valve control signal, wherein the second opening is formed on a second faceplate of the air pulse generating element, and the second faceplate is disposed at a third layer;

a third valve, configured to seal a third opening of the chamber in response to a third valve control signal, wherein the third opening is formed on the first faceplate; and a fourth valve, configured to seal a fourth opening of the chamber in response to a fourth valve control signal, wherein the fourth opening is formed on the second faceplate of the air pulse generating element; wherein the membrane and the plurality of valves are all fabricated at a first layer; and a control unit, configured to generate the plurality of valve control signals.

13. The sound producing device of claim 12, wherein the first valve is disposed by a first side of the membrane; the second valve is disposed by a second side of the membrane; the third valve is disposed by a third side of the membrane; and the fourth valve is disposed by a fourth side of the membrane.

14. The sound producing device of claim 13, wherein the first side is opposite to the second side, and the third side is opposite to the fourth side.

15. The sound producing device of claim 12, wherein the first valve and the fourth valve are disposed by a first side of the membrane; and the second valve and the third valve are disposed by a second side of the membrane.

16. The sound producing device of claim 15, wherein the first side is opposite to the second side.

17. The sound producing device of claim 12, wherein the membrane partitions the chamber into a first sub-chamber and a second sub-chamber; a first air flow direction within the first sub-chamber is between the first valve and the second valve; and a second air flow direction within the second sub-chamber is between the third valve and the fourth valve.

18. The sound producing device of claim 12, wherein the air pulse generating element generates a plurality of air pulses in response to the plurality of valve control signals at a pulse rate, and the pulse rate of the plurality of air pulses is higher than a maximum audible frequency.

* * * * *